(12) United States Patent
Zhang et al.

(10) Patent No.: US 12,550,566 B2
(45) Date of Patent: Feb. 10, 2026

(54) DISPLAY PANEL WITH AUXILIARY LAYER, METHOD FOR PREPARING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Tiaomei Zhang, Beijing (CN); Hong Yi, Beijing (CN); Haigang Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 647 days.

(21) Appl. No.: 17/921,363

(22) PCT Filed: Oct. 27, 2021

(86) PCT No.: PCT/CN2021/126837
§ 371 (c)(1),
(2) Date: Oct. 26, 2022

(87) PCT Pub. No.: WO2023/070404
PCT Pub. Date: May 4, 2023

(65) Prior Publication Data
US 2024/0389416 A1  Nov. 21, 2024

(51) Int. Cl.
H10K 59/131 (2023.01)
H10K 59/12 (2023.01)
H10K 59/122 (2023.01)

(52) U.S. Cl.
CPC ..... *H10K 59/1315* (2023.02); *H10K 59/1201* (2023.02); *H10K 59/122* (2023.02)

(58) Field of Classification Search
CPC .......... H10K 59/1315; H10K 59/1201; H10K 59/122
(Continued)

(56) References Cited

U.S. PATENT DOCUMENTS

2021/0305347 A1* 9/2021 Jeon ..................... G09G 3/3233

FOREIGN PATENT DOCUMENTS

CN  205643979 U  10/2016
CN  108538907 A  9/2018
(Continued)

*Primary Examiner* — Xia L Cross
(74) *Attorney, Agent, or Firm* — XSENSUS LLP

(57) ABSTRACT

Provided is a display panel including: a substrate; a light-emitting device disposed in a display region; at least one signal wiring disposed in a non-display region, wherein the signal wiring is electrically connected to the light-emitting device, and the signal wiring includes at least two layers of sub-signal wirings, two adjacent layers of the sub-signal wirings being disposed in different layers and lapped with each other; and at least one auxiliary layer disposed in the non-display region, wherein the auxiliary layer is disposed between two adjacent layers of the sub-signal wirings, and the auxiliary layer includes a first via, the sub-signal wiring disposed on a side, proximal to the substrate, of the auxiliary layer being lapped with the sub-signal wiring disposed on a side, distal from the substrate, of the auxiliary layer by the first via.

18 Claims, 7 Drawing Sheets

(58) Field of Classification Search
USPC .......................................................... 257/40
See application file for complete search history.

(56) References Cited

FOREIGN PATENT DOCUMENTS

| CN | 110416254 A | 11/2019 |
|---|---|---|
| CN | 108538907 B | 1/2021 |
| CN | 112582458 A | 3/2021 |
| CN | 110416254 B | 3/2022 |

* cited by examiner

DISPLAY PANEL WITH AUXILIARY LAYER, METHOD FOR PREPARING SAME, AND DISPLAY DEVICE

CROSS-REFERENCE TO RELATED APPLICATION

The present disclosure is a U.S. national stage of international application No. PCT/CN2021/126837, filed on Oct. 27, 2021, the content of which is herein incorporated by reference in its entirety.

TECHNICAL FIELD

The present disclosure relates to the field of display technologies, and in particular, relates to a display panel, a method for preparing the same, and a display device.

BACKGROUND

With the development of the display technologies, the use of the display device becomes more and more widespread. A commonly used display device includes a smart phone, a table computer, a television, and a display.

SUMMARY

Embodiments of the present disclosure provide a display panel, a method for preparing the same, and a display device.

According to some embodiments of the present disclosure, a display panel is provided.

The display panel is provided with a display region and a non-display region disposed on a periphery of the display region, wherein the display panel includes:
  a substrate;
  a light-emitting device disposed in the display region;
  at least one signal wiring disposed in the non-display region, wherein the signal wiring is electrically connected to the light-emitting device, and the signal wiring includes at least two layers of sub-signal wirings, two adjacent layers of the sub-signal wirings being disposed in different layers and lapped with each other; and
  at least one auxiliary layer disposed in the non-display region, wherein the auxiliary layer is disposed between two adjacent layers of the sub-signal wirings, and the auxiliary layer includes a first via, the sub-signal wiring disposed on a side, proximal to the substrate, of the auxiliary layer being lapped with the sub-signal wiring disposed on a side, distal from the substrate, of the auxiliary layer by the first via.

In some embodiments, the non-display region includes a fan-out region, wherein an orthographic projection of the auxiliary layer on the substrate is at least partially overlapped with an orthographic projection of the fan-out region on the substrate, and the sub-signal wiring includes a first portion disposed in the fan-out region, wherein the first portions of two layers of the sub-signal wirings are lapped with each other by the first via.

In some embodiments, the orthographic projection of the auxiliary layer on the substrate is within the orthographic projection of the fan-out region on the substrate, and the sub-signal wiring includes a second portion disposed outside the fan-out region, wherein the second portions of two layers of the sub-signal wirings are contacted.

In some embodiments, the display panel further includes a plurality of fan-out leads disposed in the fan-out region and insulated from the signal wiring, wherein an orthographic projection of at least a portion of the first via on the substrate is within an orthographic projection of the fan-out lead on the substrate;
  wherein the fan-out lead is configured to be electrically connected to a data signal line in the display region, the data signal line being electrically connected to the light-emitting device.

In some embodiments, the fan-out lead includes: a sub fan-out lead, an interposer lead, and a compensation lead that are successively connected in series, wherein one end, distal from the interposer lead, of the sub fan-out lead is configured to be electrically connected to the data signal line, and one end, distal from the interposer lead, of the compensation lead is configured to be electrically connected to a drive chip;
  wherein a wiring density of the sub fan-out leads in the fan-out region and a wiring density of the compensation leads in the fan-out region are both greater than a wiring density of the interposer leads in the fan-out region, and the orthographic projection of the auxiliary layer on the substrate is within a region where the sub fan-out lead is disposed and a region where the compensation lead is disposed, and is outside a region where the interposer lead is disposed.

In some embodiments, any two adjacent of the fan-out leads are disposed in different layers.

In some embodiments, in two layers of the sub-signal wirings, the sub-signal wiring that is distal from the substrate relative to the auxiliary layer includes a second via, wherein an orthographic projection of the second via on the substrate is staggered from an orthographic projection of the first via on the substrate.

In some embodiments, the at least one signal wiring includes a first power supply signal wiring, wherein the first power supply signal wiring includes: a first sub-signal wiring, a second sub-signal wiring, and a third sub-signal wiring that are arranged in a direction perpendicular to and facing away from the substrate; and
  the at least one auxiliary layer includes a first auxiliary layer disposed between the second sub-signal wiring and the third sub-signal wiring.

In some embodiments, the at least one auxiliary layer further includes a second auxiliary layer disposed between the first sub-signal wiring and the second sub-signal wiring, wherein an orthographic projection of the first via in the first auxiliary layer on the substrate is at least partially overlapped with an orthographic projection of the first via in the second auxiliary layer on the substrate.

In some embodiments, the second sub-signal wiring and the third sub-signal wiring both include the second via, wherein an orthographic projection of the second via in the second sub-signal wiring on the substrate is at least partially overlapped with an orthographic projection of the second via in the third sub-signal wiring on the substrate, and the orthographic projection of the second via on the substrate is staggered from the orthographic projection of the first via on the substrate.

In some embodiments, the at least one signal wiring further includes a second power supply signal wiring, wherein the second power supply signal wiring includes: a fourth sub-signal wiring disposed in a same layer with the first sub-signal wiring and a fifth sub-signal wiring disposed in a same layer with the second sub-signal wiring; and the at least one auxiliary layer further includes a second auxiliary layer disposed between the fourth sub-signal wiring and the fifth sub-signal wiring.

In some embodiments, an orthographic projection of the third sub-signal wiring on the substrate is at least partially overlapped with an orthographic projection of the fourth sub-signal wiring on the substrate, and the third sub-signal wiring is insulated from the fifth sub-signal wiring by the first auxiliary layer.

In some embodiments, the display panel includes, an anode layer, a light-emitting layer, and a cathode layer that are stacked arranged, and the anode layer, the light-emitting layer, and the cathode layer that are stacked arranged form the light-emitting device, wherein the first power supply signal wiring is electrically connected to the cathode layer, and the anode layer is configured to be electrically connected to the second power supply signal wiring.

In some embodiments, the display panel further includes a pixel definition layer, wherein a portion of the pixel definition layer disposed within the non-display region includes a third via, an orthographic projection of the third via on the substrate being within the orthographic projection of the third sub-signal wiring on the substrate, and a portion of the cathode layer disposed within the non-display region being lapped with the third sub-signal wiring by the third via.

In some embodiments, the display panel further includes a pixel drive circuit disposed in the display region and electrically connected to the anode layer, wherein the first sub-signal wiring and a conductive structure in the pixel drive circuit are arranged in a same layer, the second sub-signal wiring and another conductive structure in the pixel drive circuit are arranged in a same layer, and the third sub-signal wiring and the anode layer are arranged in a same layer.

In some embodiments, the display panel further includes a package layer disposed on a side, distal from the substrate, of the light-emitting device.

According to some embodiments of the present disclosure, a method for preparing a display panel is provided, the method including:

forming a light-emitting device, at least one signal wiring, and at least one auxiliary layer on a substrate; wherein the display panel is provided with a display region and a non-display region disposed on a periphery of the display region, w % herein the light-emitting device is disposed in the display region, and the at least on signal wiring and the at least one auxiliary layer are disposed in the non-display region;

the signal wiring is electrically connected to the light-emitting device, and the signal wiring includes at least two layers of sub-signal wirings, wherein two adjacent layers of the sub-signal wirings are arranged in different layers and lapped with each other; and the auxiliary layer is disposed between two adjacent layers of the sub-signal wirings, and the auxiliary layer includes a first via, wherein the sub-signal wiring disposed on a side, proximal to the substrate, of the auxiliary layer is lapped with the sub-signal wiring disposed on a side, distal from the substrate, of the auxiliary layer by the first via.

According to some embodiments of the present disclosure, a display device is provided, the display device including: a power supply assembly, and the display panel as described above;

wherein the power supply assembly is connected to the display panel, and is configured to supply power to the display panel.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

The present disclosure is described in further detail with reference to the enclosed drawings, to clearly present the objects, technical solutions, and advantages of the present disclosure.

In some practices, the display device generally includes a display panel and a drive chip. The display panel is provided with a display region and a non-display region, and the display panel includes: a plurality of light-emitting devices disposed in the display region, and power supply signal wirings disposed in the non-display region. For example, the power supply signal wirings are a VDD power supply signal wiring and a VSS power supply signal wiring. The power supply signal wiring is electrically connected to the drive chip and the light-emitting device, such that the drive chip provides a power supply signal to the light-emitting device by the power supply signal wiring.

However, the flatness of the power supply signal wiring disposed in the non-display region is generally poor, such that a film layer (e.g., a package layer) disposed above the power supply signal wiring in the display panel is prone to the film fracture or the film separation, and thus the yield of the display panel is low.

Figure 1:
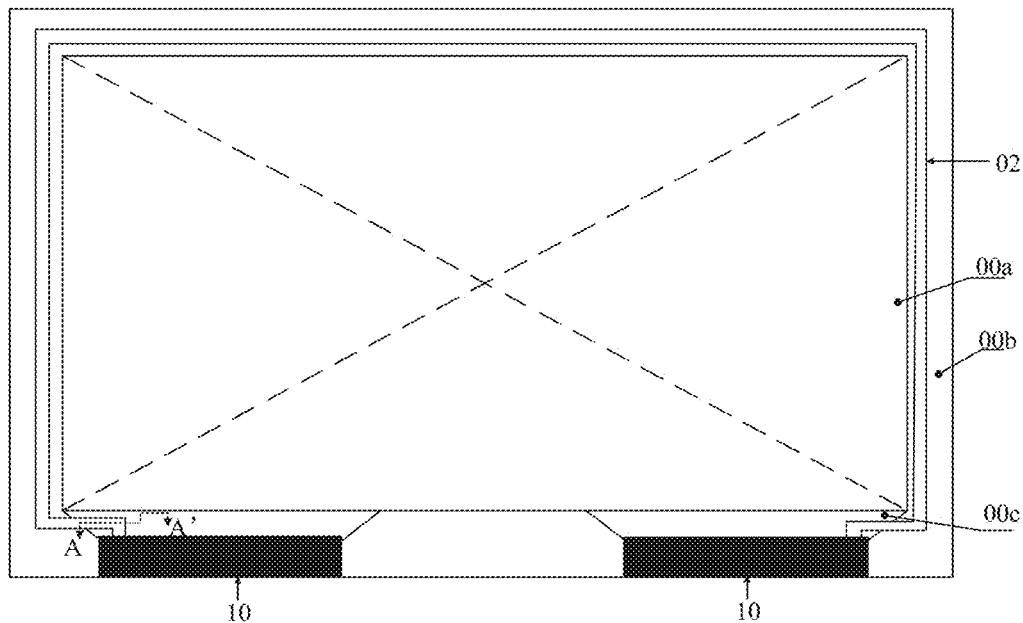
FIG. 1 is a top view of a display panel according to some practices.

Referring to FIG. 1, FIG. 1 is a top view of a display panel according to some practices. In the practices, the display device includes: a display panel 00 and a drive chip 10. The display panel 00 is provided with a display region 00a and a non-display region 00b.

Figure 2:
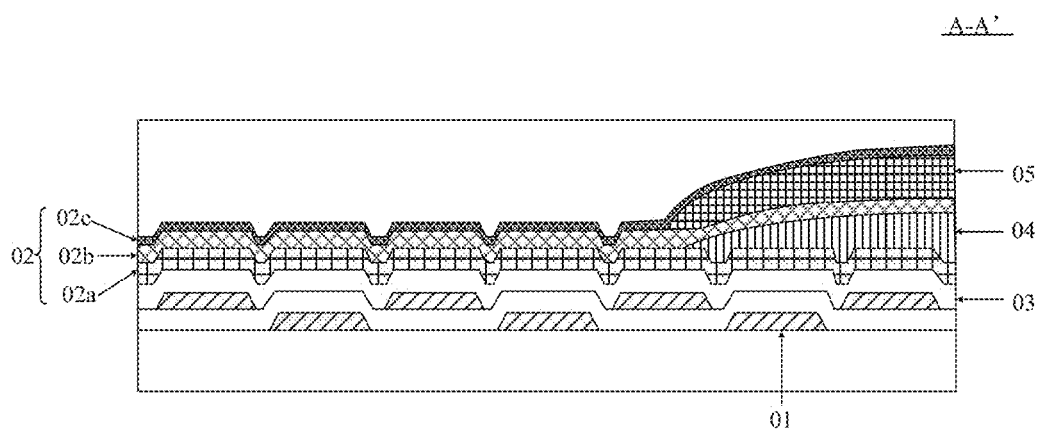
FIG. 2 is a structural schematic diagram of a film layer at a line A-A' of a display panel in the display device shown in FIG. 1.

For clearer display of a film layer structure of the display panel 00, referring to FIG. 2, FIG. 2 is a structural schematic diagram of a film layer at a line A-A' of a display panel in the display device shown in FIG. 1. The display panel 00 includes: a plurality of light-emitting devices (not shown in FIG. 2) disposed in the display region 00a, and a fan-out lead 01 and a power supply signal wiring 02 that are disposed in the non-display region 00b. A region where the fan-out lead 01 is disposed is referred to as a fan-out region 00c. In the fan-out region 00c, the fan-out lead 01 and the power supply signal wiring 02 are required to be insulated from each other by an inorganic insulative layer 03.

One end of the fan-out lead 01 is electrically connected to the light-emitting device by a data signal line disposed in display region 00a, and the other end of the fan-out lead 01 is electrically connected to the drive chip 10. In this way, the drive chip 10 provides data signals to the light-emitting device by the fan-out lead 01 and the data signal line.

The power supply signal wiring 02 is a VSS power supply signal wiring. One end of the VSS power supply signal wiring is electrically connected to the light-emitting device, and the other end is electrically connected to the drive chip 10. In this way, the drive chip 10 provides a VSS power supply signal to the light-emitting device by the VSS power supply signal wiring.

To improve the conductivity of the power supply signal wiring 02, a resistance of the power supply signal wiring 02 is required to be small. Therefore, the power supply signal wiring 02 is generally composed of a plurality of metal layers that are mutually lapped. In this way, a cross-sectional area of the power supply signal wiring 02 is large, such that the resistance of the power supply signal wiring 02 is small. For example, the power supply signal wiring 02 includes: a first sub-signal wiring 02a, a second sub-signal wiring 02b, and a third sub-signal wiring 02c. The metal layers where the sub-signal wirings are disposed are different. The metal layer where the first sub-signal wiring 02a is disposed and the metal layer where the second sub-signal wiring 02b is disposed are required to be insulated from each other in other regions of the display panel 00 (such as the display region 00a) by a first flat layer 04. The metal layer where the second sub-signal wiring 02b is disposed and the metal layer where the third sub-signal wiring 02c is disposed are required to be insulated from each other in other regions of the display panel 00 by a second flat layer 05.

However, a wiring density of the fan-out leads 01 within the fan-out region 00c is great. That is, a distance between any two adjacent fan-out leads 01 is small. In this way, the flatness of the inorganic insulative layer 03 is poor, such that the flatness of the power supply signal wiring 02 disposed on a side, distal from the fan-out lead 01, of the inorganic insulative layer 03 is poor.

Figure 3:
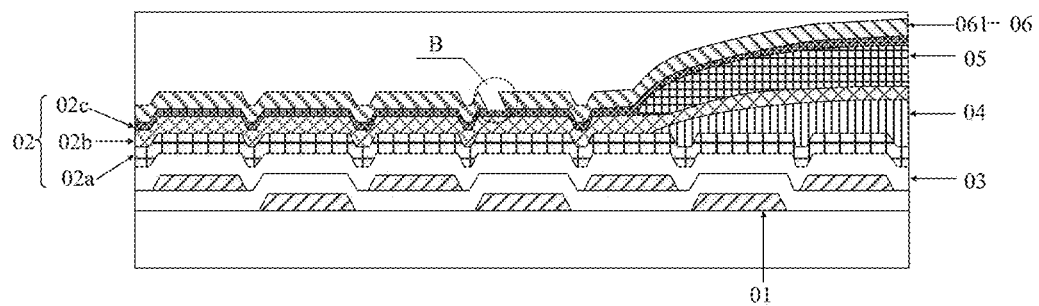
FIG. 3 is an effect diagram of a package layer occurring a film fracture.
Figure 4:
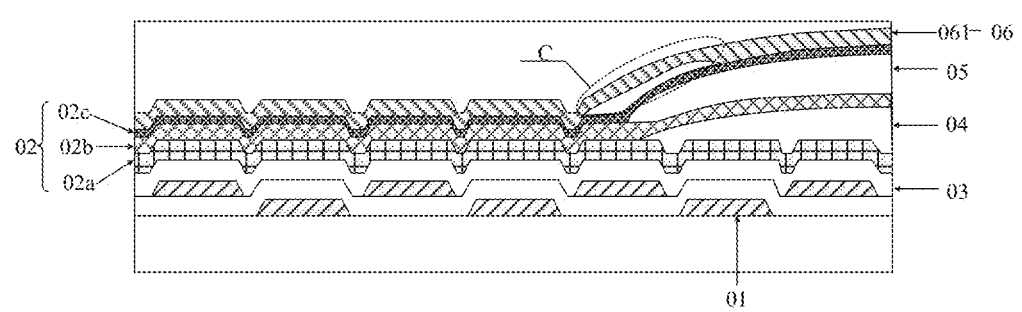
FIG. 4 is an effect diagram of a package layer occurring a film separation.

In this way, in the case that a package layer 06 is formed on the power supply signal wiring 02 of which the flatness is poor, the package layer 06 is prone to the film fracture or the film separation. For example, as illustrated in FIG. 3 and FIG. 4, FIG. 3 is an effect diagram of a package layer occurring a film fracture, and FIG. 4 is an effect diagram of a package layer occurring a film separation. The second sub-signal wiring 02b and the first sub-signal wiring 02a are required to be lapped with each other, and thus in the case that the flatness of the power supply signal wiring 02 is poor, a segment difference height of the second sub-signal wiring 02b disposed on an edge of the first flat layer 04 is increased. The third sub-signal wiring 02c and the second sub-signal wiring 02b are also required to be lapped with each other, and the third sub-signal wiring 02 is disposed above the second sub-signal wiring 02b. Therefore, a segment difference height of the third sub-signal wiring 02c disposed on an edge of the second flat layer 05 is further increased, such that an inorganic package layer 061 in the package layer 05 is prone to the film fracture at a position B or the film separation at a position C. In the case that the film facture or the film separation are occurred in the package layer 06 in the display panel 00, the water and oxygen in the external environment is prone to penetrate into the display panel 00, resulting in the failure of the organic luminescent material in the light-emitting device, such that the yield of the display panel 00 is low.

Figure 5:
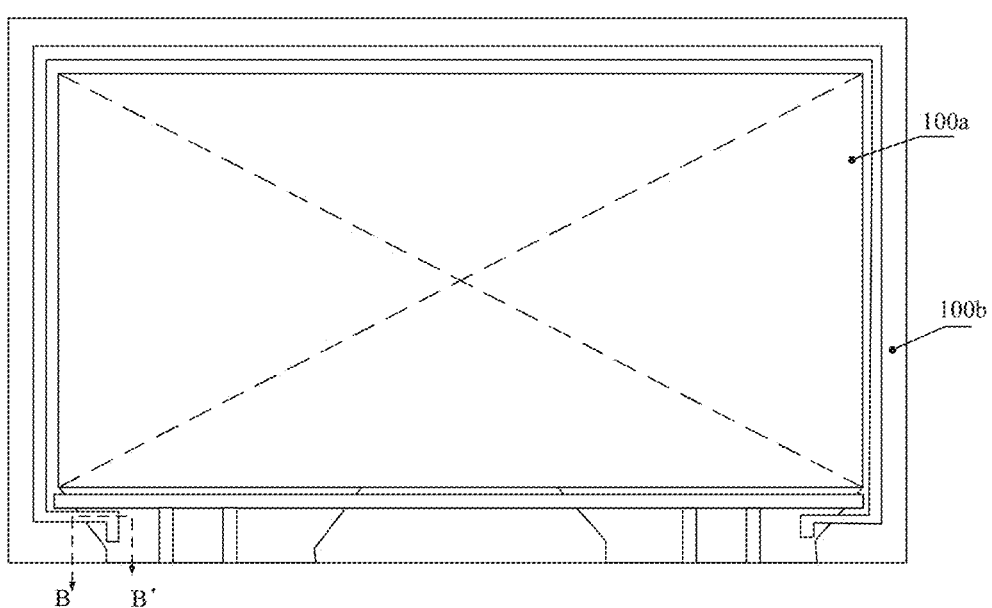
FIG. 5 is a top view of a display panel according to some embodiments of the present disclosure.

Referring to FIG. 5, FIG. 5 is a top view of a display panel according to some embodiments of the present disclosure. The display panel 000 is an organic light emitting display (OLED) panel or an active matrix-organic light emitting diode (AM-OLED) display panel. The display panel 000 is a top-emitting type display panel or a bottom-emitting type display panel. The display panel is provided with a display region 10a and a non-display region 100b disposed on a periphery of the display region 100a.

The display panel 000 includes a substrate 100. The substrate 100 is provided with the display region 100a and the non-display region 100b disposed on the periphery of the display region 100a.

Figure 6:
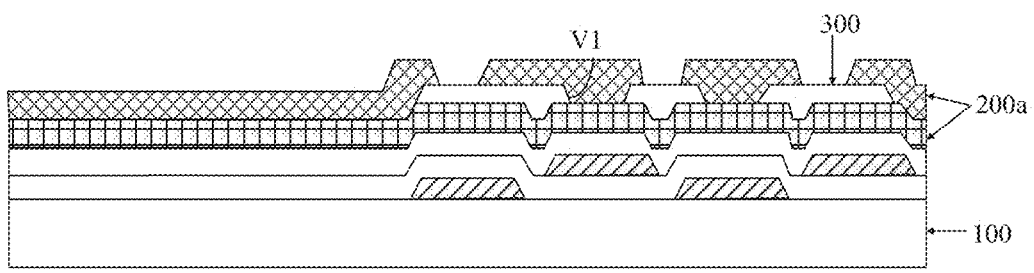
FIG. 6 is a structural schematic diagram of a film layer at a line B-B' of the display panel shown in FIG. 5.

For clearer display of a film layer structure of the display panel 000, referring to FIG. 6, FIG. 6 is a structural schematic diagram of a film layer at a line B-B' of the display panel shown in FIG. 6. The display panel 000 further includes: a light-emitting device (not shown in FIG. 6) disposed in the display region 100a and at least one signal wiring 200 disposed in the non-display region 100b. The at least one signal wiring 200 includes at least one of: a VSS power supply signal wiring, a VDD power supply signal wiring, and an initialization signal wiring. Each of the signal wirings 200 is electrically connected to the light-emitting device, and is configured to be electrically connected to a drive chip. In this way, the drive chip provides signals to the light-emitting device by the signal wiring 200, such that the light-emitting device emits light according to the signals provided by the drive chip, and thus the display panel 000 displays pictures normally. The signal wiring 200 includes at least two layers of sub-signal wirings 200a that are arranged in different layers. In the at least two layers of sub-signal wirings 200a that are arranged in different layer, any two adjacent layers of the sub-signal wirings 200a are lapped with each other. In this way, a cross-sectional area of the signal wiring 200 is large, such that a resistance of the signal wiring is small, and thus the conductivity of the signal wiring is great.

The display panel 000 further includes at least one auxiliary layer 300 disposed in the non-display region 100b. The auxiliary layer 300 is disposed between two adjacent layers of the sub-signal wirings 200a. The auxiliary layer 300 includes a first via V1, the two layers of the sub-signal wirings 200a disposed on both sides of the auxiliary layer 300 are lapped with each other by the first via V1. The two layers of the sub-signal wirings 200a disposed on both sides of the auxiliary layer 300 refers to: the sub-signal wiring 200a disposed on a side, proximal to the substrate 100, of the auxiliary layer 300 is lapped with the sub-signal wiring 200a disposed on a side, distal from the substrate 100, of the auxiliary layer 300 by the first via V1.

It should be noted that, the auxiliary layer 300 according to some embodiments of the present disclosure is an auxiliary flat layer of which the flatness is great.

In the present disclosure, the auxiliary layer 300 is disposed between two adjacent layers of the sub-signal wirings 200a, and the two layers of the sub-signal wirings 200a disposed on both sides of the auxiliary layer 300 are lapped with each other by the first via V1 in the auxiliary layer 300. Therefore, on the basis of ensuring that the two adjacent layers of the sub-signal wirings 200a are normally lapped, the flatness of the sub-signal wiring 200a, distal from the substrate 100, in the two adjacent layers of the sub-signal wirings 200a is improved by the auxiliary layer 300. That is, the flatness of the sub-signal wiring 200a disposed on the side, distal from the substrate 100, of the auxiliary layer 300 is great. In this way, the flatness of the signal wiring 200 is great, such that the probability of the film fracture or the film separation occurred in film layers (e.g., the package layer) disposed above the sub-signal wiring 200a in the display panel 000 is effectively reduced, and thus the yield of the display panel 000 is effectively improved.

In summary, the display panel according to the embodiments of the present disclosure includes: the substrate, the light-emitting device, the signal wiring, and the auxiliary layer. The auxiliary layer is disposed between two adjacent layers of the sub-signal wirings, and the two layers of the sub-signal wirings disposed on both sides of the auxiliary layer are lapped with each other by the first via in the auxiliary layer. Therefore, on the basis of ensuring that the two adjacent layers of the sub-signal wirings are normally lapped, the flatness of the sub-signal wiring, distal from the substrate, in the two adjacent layers of the sub-signal wirings is improved by the auxiliary layer, such that the flatness of the signal wiring is great. In this way, the probability of the film fracture or the film separation occurred in film layers (e.g., the package layer) disposed above the sub-signal wiring in the display panel is effectively reduced, and thus the yield of the display panel is effectively improved.

Figure 7:
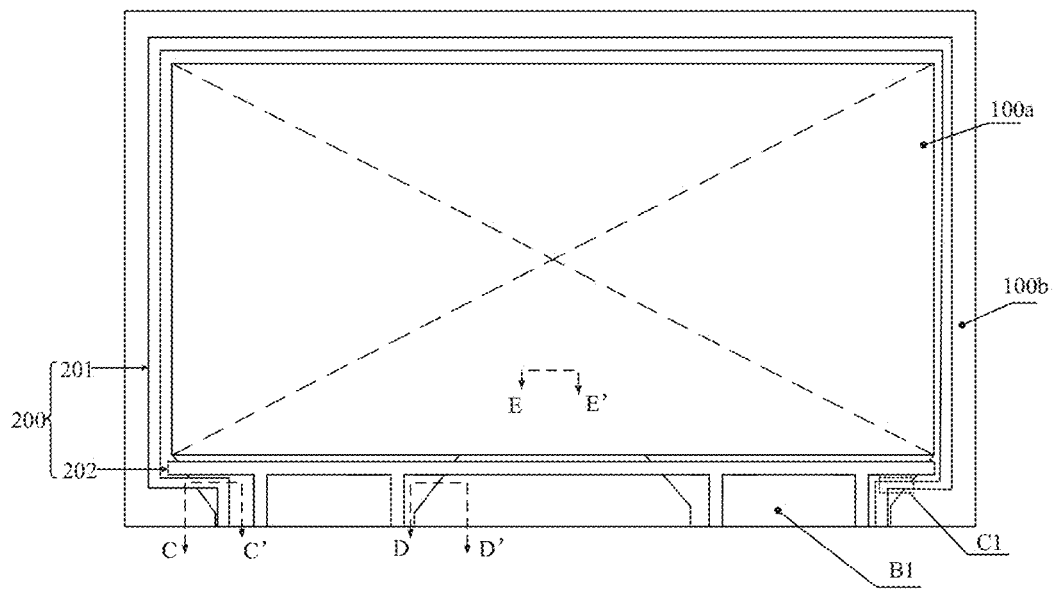
FIG. 7 is a top view of another display panel according to some embodiments of the present disclosure.
Figure 8:
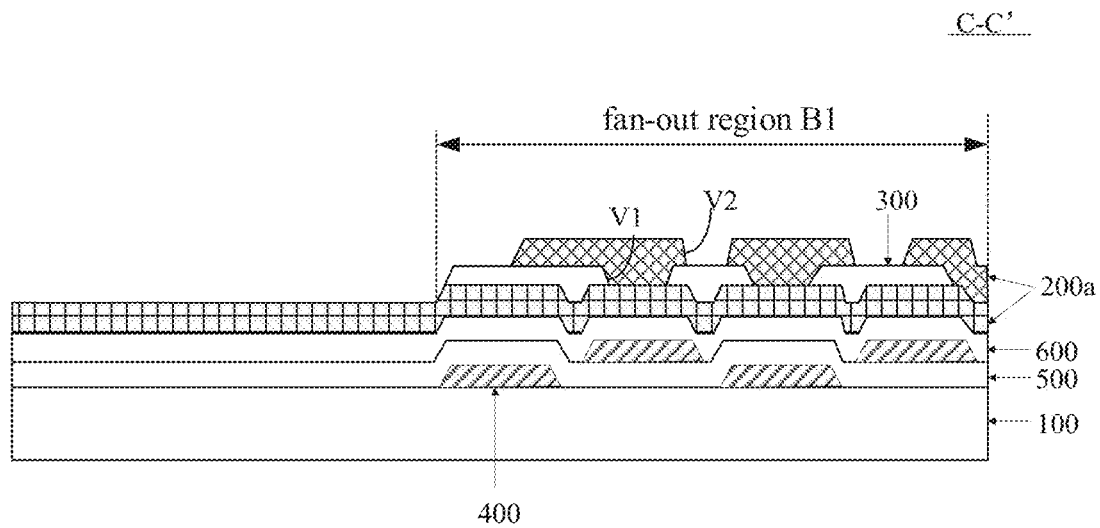
FIG. 8 is a is a structural schematic diagram of a film layer at a line C-C' of the display panel shown in FIG. 7.

Optionally, referring to FIG. 7 and FIG. 8, FIG. 7 is a top view of another display panel according to some embodiments of the present disclosure, and FIG. 8 is a is a structural schematic diagram of a film layer at a line C-C' of the display panel shown in FIG. 7. The non-display region 100b in the display panel 000 is provided with a fan-out region B1. The display panel 000 further includes a plurality of fan-out leads 400 disposed in the fan-out region B1 and insulated from the signal wiring 200. The fan-out lead 400 is configured to be electrically connected to a data signal line in the display region 100a, and the data signal line is electrically connected to the light-emitting device. The fan-out lead 400 is further configured to be electrically connected to the drive chip. In this way, the drive chip provides data signals to the light-emitting device by the data signal line and the fan-out lead 400.

In the present disclosure, in order to improve a screen-to-body ratio of the display panel 000, a width of the non-display region 100b in the display panel 000 is required to be reduced. The width of the non-display region 100b is typically positive correlated with a distance between any two adjacent fan-out leads 400. Therefore, the plurality of fan-out leads 400 typically use a wiring mode of double-layer wiring to reduce the distance between any two adjacent fan-out leads 400. In this case, any two adjacent fan-out leads 400 in the plurality of fan-out leads 400 are arranged in different layers.

Exemplarily, the plurality of fan-out leads 400 include: a first fan-out lead group and a second fan-out lead group. At least two fan-out leads 400 in the first fan-out lead group are arranged in a same layer, and are made of a same material; and at least two fan-out leads 400 in the second fan-out lead group are arranged in a same layer. A first inorganic insulative layer 500 is arranged between the at least two fan-out leads 400 in the first fan-out lead group and the at least two fan-out leads 400 in the second fan-out lead group, and the at least two fan-out leads 400 in the first fan-out lead group are insulated from the at least two fan-out leads 400 in the second fan-out lead group by the first inorganic insulative layer 500. The at least two fan-out leads 400 in the first fan-out lead group and the at least two fan-out leads 400 in the second fan-out lead group are arranged staggered.

In some embodiments of the present disclosure, a second inorganic insulative layer 600 is arranged between the fan-out lead 400 disposed on a side, distal from the substrate 100, of the first inorganic insulative layer 500 and the signal wiring 200. The fan-out lead 400 disposed on the side, distal from the substrate 100, of the first inorganic insulative layer 500 is insulated from the signal wiring 200 by the second inorganic insulative layer 600.

The plurality of fan-out leads 400 are arranged in the fan-out region B1. Therefore, the flatness of the second inorganic insulative layer 600 disposed on a side, distal from the substrate 100, of the fan-out lead 400 in the fan-out region B1 is poor, resulting in the flatness of the sub-signal wiring 200a, distal from the substrate 100, of the second inorganic insulative layer 600 is poor. Therefore, an orthographic projection of the auxiliary layer 300 in the display panel 000 according to some embodiments of the present disclosure on the substrate 100 is at least partially overlapped with an orthographic projection of the fan-out region B1 on the substrate 100. Furthermore, in some embodiments, the orthographic projection of the auxiliary layer 300 on the substrate 100 is within the orthographic projection of the fan-out region B1 on the substrate 100. That is, the auxiliary layer 300 is arranged within the fan-out region B1 The flatness of the sub-signal wiring 200a disposed on the side, distal from the substrate 100, of the auxiliary layer 300 is improved by the auxiliary layer 300.

In this case, the sub-signal wiring 200a is provided with a first portion disposed in the fan-out region B1, and the first portions of the two layers of the sub-signal wirings 200a disposed on both sides of the auxiliary layer 300 are lapped with each other by the first via V1 in the auxiliary layer 300. Therefore, on the basis of ensuring that the two layers of the sub-signal wirings 200a are normally lapped in the fan-out region B1, the flatness of the sub-signal wiring 200a disposed on the side, distal from the substrate 100, of the auxiliary layer 300 is great. In addition, a thickness of the auxiliary layer 300 is small and typically ranges from 20% to 40% of a thickness of a flat layer in the display region 100a. For example, the thickness of the auxiliary layer 300 ranges from 3000 Å to 6000 Å. In this way, in the case that the thickness of the auxiliary layer 300 is small, a segment difference height of the sub-signal wiring 200a disposed on the side, distal from the substrate 100, of the auxiliary layer 300 is further reduced, and thus the flatness of the sub-signal wiring 200a disposed on the side, distal from the substrate 100, of the auxiliary layer 300 is further improved.

In some embodiments of the present disclosure, as illustrated in FIG. 8, the orthographic projection of the auxiliary layer 300 on the substrate 100 is within the orthographic projection of the fan-out region B1 on the substrate 100. The sub-signal wiring 200a is further provided with a second portion disposed outside the fan-out region B1. Because the fan-out lead 400 is not arranged outside the fan-out region B1, the flatness of a portion, disposed outside the fan-out region B1, of the second inorganic insulative layer 600 is great. In this way, the auxiliary layer 400 is not required to be arranged outside the fan-out region B1, and the flatness of the signal wiring 200 is great. In this case, the second portions of any two adjacent layers of the sub-signal wirings 200a disposed on both sides of the auxiliary layer 300 are in contact, such that a lap area of the second portions of the any two adjacent layers of the sub-signal wirings 200a is large, and thus a transmission effect of electrical signals between the any two adjacent layers of the sub-signal wirings 200a is great.

Optionally, an orthographic projection of at least a portion of the first via V1 in the auxiliary layer 300 on the substrate 100 is within the orthographic projection of the fan-out lead 400 on the substrate 100. In this case, the auxiliary layer 300 covers a region between any two adjacent fan-out leads 400. In the case that a wiring density of the fan-out leads 400 in the fan-out region B1 is great, the flatness of the region between any two adjacent fan-out leads 400 is poor, and the auxiliary layer 300 enables the region between any two adjacent fan-out leads 400 to be flattened. In this way, the flatness of the signal wiring 200 disposed on the side, distal from the substrate 100, of the auxiliary layer 300 is further improved.

Figure 9:
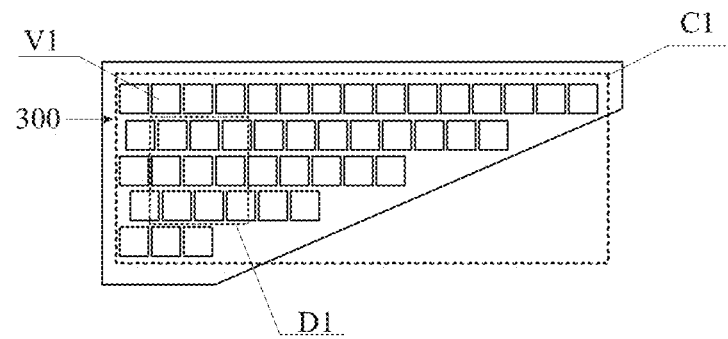
FIG. 9 is a partially enlarged view of an auxiliary layer at a portion C1 of the display panel shown in FIG. 7.
Figure 10:
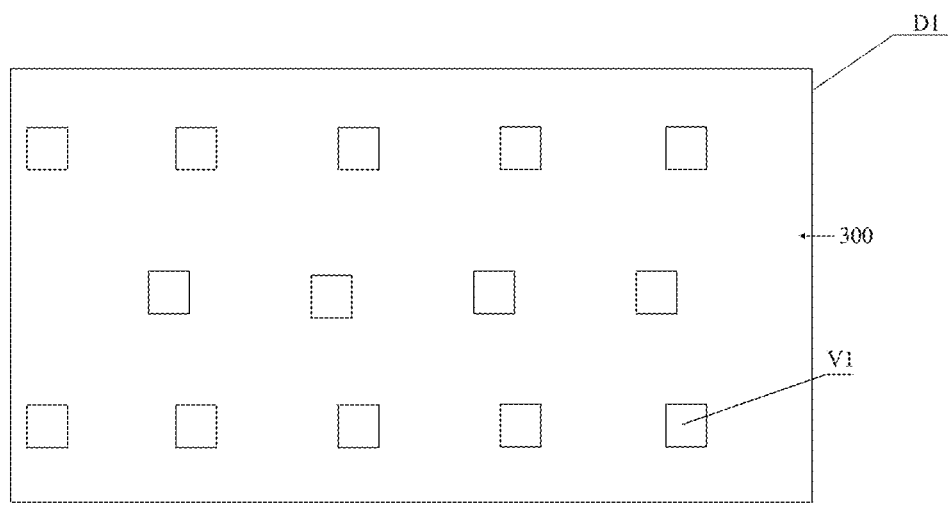
FIG. 10 is a partially enlarged view of a portion D1 shown in FIG. 9.

Exemplarily, referring to FIG. 9 and FIG. 10. FIG. 9 is a partially enlarged view of an auxiliary layer at a portion C1 of the display panel shown in FIG. 7, and FIG. 10 is a partially enlarged view of a portion D1 shown in FIG. 9. An opening of the via V1 in the auxiliary layer 300 is rectangular or circular, or other shapes, which is not limited herein. In the case that a cross section of the first via V1 is rectangular, a width of the first via V1 ranges from 5 μm to 25 μm; and in the case that the cross section of the first via V1 is circular, a diameter of the first via V1 ranges from 5 μm to 25 μm.

Figure 11:
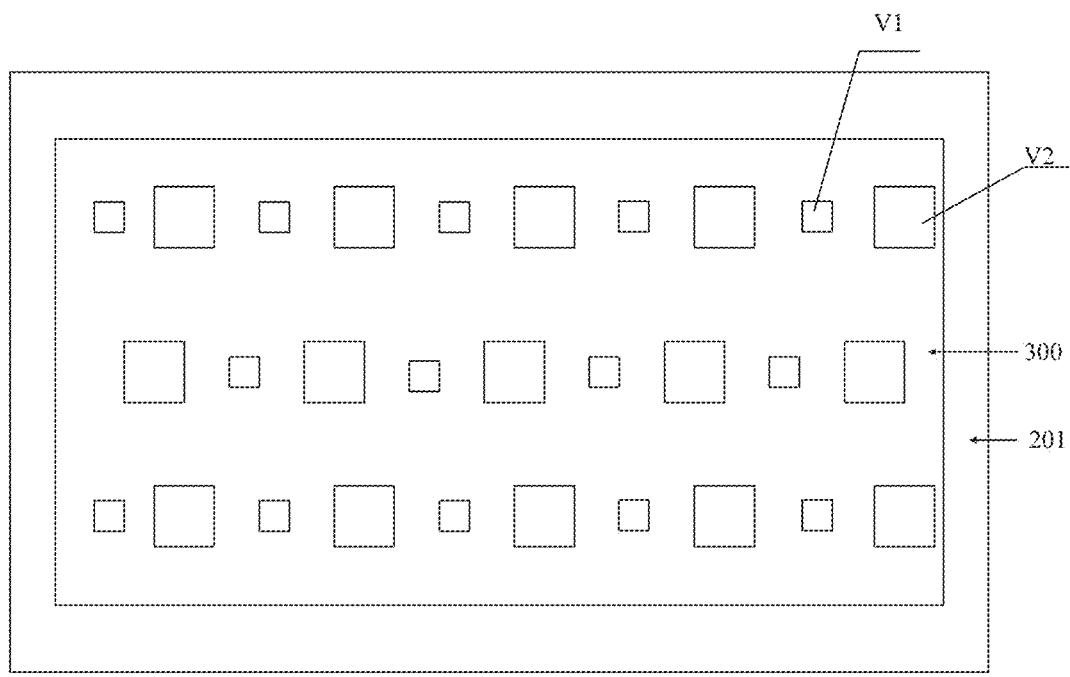
FIG. 11 is a position schematic diagram of a first via and a second via in a display panel according to some embodiments of the present disclosure.

In some embodiments of the present disclosure, as illustrated in FIG. 8, in the two layers of the sub-signal wirings 200a disposed on both sides of the auxiliary layer 300, the sub-signal wiring 200a that is distal from the substrate 100 relative to the auxiliary layer 300 includes a second via V2. As illustrated in FIG. 11, FIG. 11 is a position schematic diagram of a first via and a second via in a display panel according to some embodiments of the present disclosure. An orthographic projection of the second via V2 in the sub-signal wiring 200a on the substrate 100 is staggered from an orthographic projection of the first via V1 in the auxiliary layer 300 on the substrate 100. In this way, the water vapor absorbed by the auxiliary layer 300 during preparing process is released by the second via V2, such that the sub-signal wiring 200a disposed on the side, distal from the substrate 100, of the auxiliary layer 300 is prevented from bulging, and thus the flatness of the sub-signal wiring 200a is great and the transmission effect of electrical signals transmitted by the sub-signal wiring 200a is great.

Exemplarily, a cross section of the second via V2 is rectangular or circular, or other shapes, which is not limited herein. In the case that the cross section of the second via V2 is rectangular, a width of the second via V2 ranges from 5 μm to 30 μm; and in the case that the cross section of the second via V2 is circular, a diameter of the second via V2 ranges from 5 μm to 30 μm.

Figure 12:
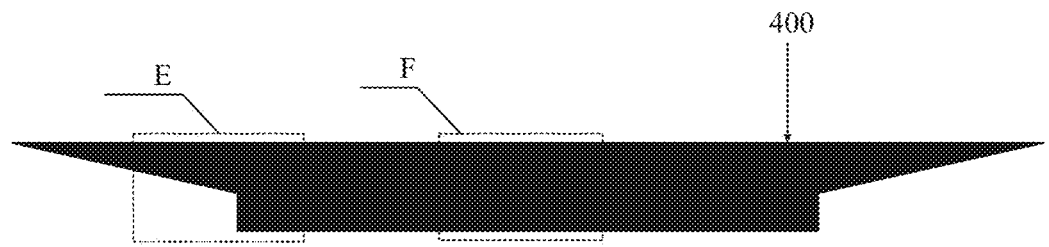
FIG. 12 is an arrangement schematic diagram of fan-out leads within a fan-out region according to some embodiments of the present disclosure.
Figure 13:
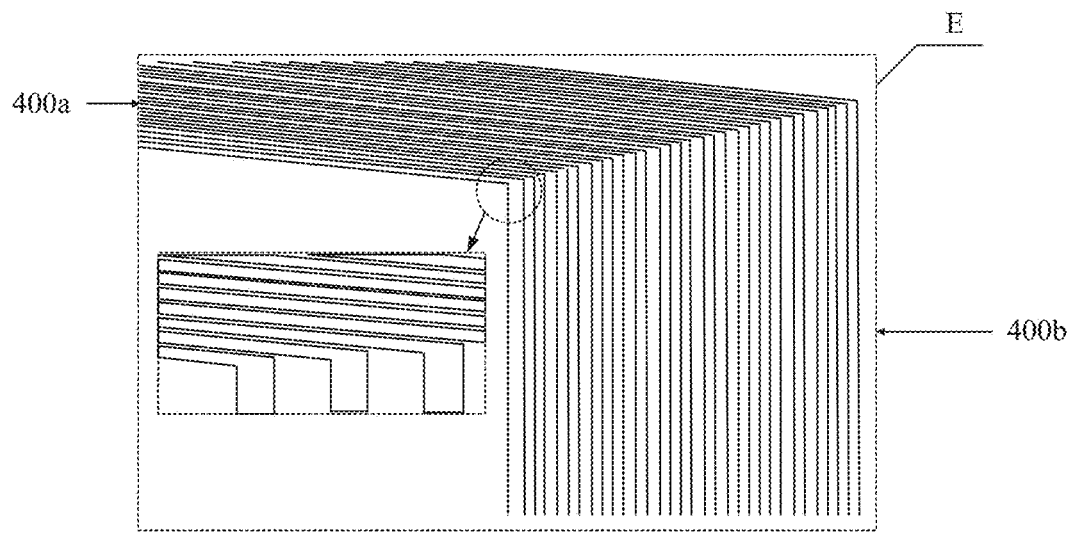
FIG. 13 is a partially enlarged view of a portion E shown in FIG. 12.
Figure 14:
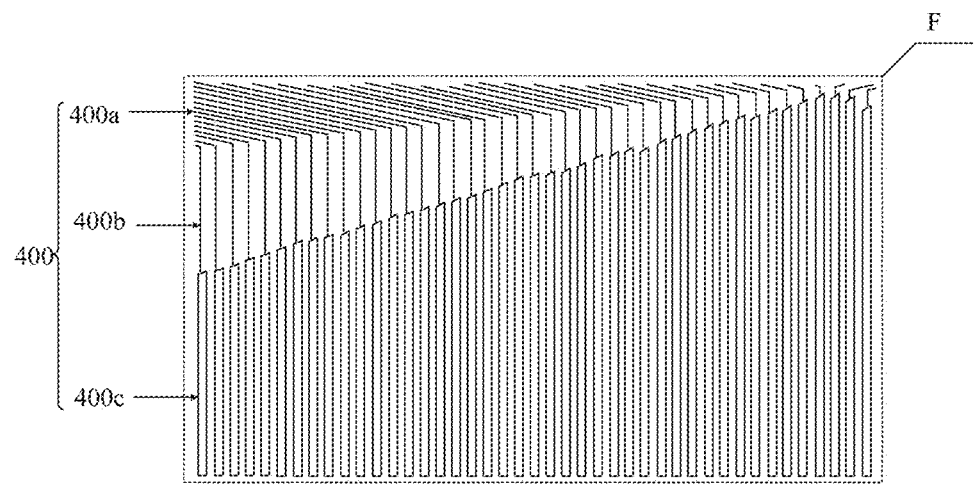
FIG. 14 is a partially enlarged view of a portion F shown in FIG. 12.

Optionally, as illustrated in FIG. 12, FIG. 13, and FIG. 14, FIG. 12 is an arrangement schematic diagram of fan-out leads within a fan-out region according to some embodiments of the present disclosure, FIG. 13 is a partially enlarged view of a portion E shown in FIG. 12, and FIG. 14 is a partially enlarged view of a portion F shown in FIG. 12. A portion of the plurality of fan-out leads 400 in the fan-out region B1 include: a sub fan-out lead 400a and an interposer lead 400b that are connected in series; and another portion of the plurality of fan-out leads 400 include: a sub fan-out lead 400a, an interposer lead 400b, and a compensation lead 400c that are connected successively in series.

As illustrated in FIG. 14, the portion of the plurality of fan-out leads 400 including the sub fan-out lead 400a, the interposer lead 400b, and the compensation lead 400c are typically disposed in a central region of the fan-out region B1. Moreover, the sums of lengths of the sub fan-out leads 400a and lengths of the interposer leads 400b in different fan-out leads 400 of the portion of the plurality of fan-out leads 400 are different. Therefore, the compensation lead 400c is required to be arranged to ensure that resistances of the fan-out leads 400 are equal. The compensation lead 400c is typically an S-shaped wire. A length of the compensation lead 400c in each fan-out lead 400 is negatively correlated with the sum of the length of the sub fan-out lead 400a and the length of the interposer lead 400b in the fan-out lead 400. That is, the shorter the sum of the length of the sub fan-out lead 400a and the length of the interposer lead 400b in the fan-out lead 400 is, the longer the length of the compensation lead 400c in the fan-out lead 400 is. In this case, one end, distal from the interposer lead 400b, of the sub fan-out wire 400a in the fan-out lead 400 is electrically connected to the data signal line, and one end, distal from the interposer lead 400b, of the compensation lead 400c is configured to be electrically connected to the drive chip.

As illustrated in FIG. 13, the portion of the plurality of fan-out leads 40 only including the sub fan-out lead 400a and the interposer lead 400b are typically disposed in a peripheral region on both sides of the central region in the fan-out region B1. Moreover, in the portion of the plurality of fan-out leads 400, the sums of lengths of the sub fan-out wires 400a and lengths of the interposer leads 400b are approximately equal, such that resistances of the fan-out leads 400 are approximately equal. In this case, one end, distal from the interposer lead 400b, of the sub fan-out wire 400a is electrically connected to the data signal line, and one end, distal from the sub fan-out lead 400a, of the interposer lead 400b is configured to be electrically connected to the drive chip.

As illustrated in FIG. 13 and FIG. 14, in the fan-out region B1, a wiring density of the sub fan-out leads 400a and a wiring density of the compensation leads 400c are both greater than a wring density of the interposer leads 400b. That is, a distance between any two adjacent sub fan-out leads 400a and a distance between any two adjacent compensation leads 400c are both less than a distance between any two adjacent interposer leads 400b. Exemplarily, the distance between two adjacent sub fan-out leads 400a is 4 µm, the distance between two adjacent interposer leads 400b is 25.6 µm, and the distance between two adjacent compensation leads 400c is 6.2 µm.

In this case, the wiring density of the sub fan-out wires 400a and the wiring density of the compensation wires 400c are large, such that the flatness of the second inorganic insulative layer 600 disposed above the sub fan-out lead 400a and the compensation lead 400c is poor. Therefore, the auxiliary layer 300 is required to be arranged in a region where the sub fan-out lead 400a is disposed and a region where the compensation lead 400c is disposed to improve the flatness of the signal wiring 200 in the above regions. Moreover, the wiring density of two adjacent interposer leads 400b is small, and the flatness of the second inorganic insulative layer 600 above the interposer lead 400b is great. In a case that the auxiliary layer 300 is arranged in a region where the interposer lead 400b is disposed, the flatness of the signal wiring 200 in the region deteriorates. Therefore, the auxiliary layer 300 is not required to be arranged in the region where the interposer lead 400b is disposed.

In this way, the orthographic projection of the auxiliary layer 300 on the substrate 100 is within the region where the sub fan-out lead 400a is disposed and the region where the compensation lead 400c is disposed, and is outside the region where the interposer lead 400b is disposed. Therefore, the flatness of the sub-signal wiring 200 disposed on the side, distal from the substrate 100, of the auxiliary layer 300 is ensured to be as great as possible.

In some embodiments of the present disclosure, as illustrated in FIG. 7, the at least one signal wiring 200 disposed in the non-display region 100b includes at least one of: a first power supply signal wiring 201, a second power supply signal wiring 202, and a compensation signal wiring (not shown in FIG. 7). Layers of sub-signal wirings included in different types of signal wirings are different. Therefore, the embodiments of the present disclosure give description using two optional implementations as an example.

Figure 15:
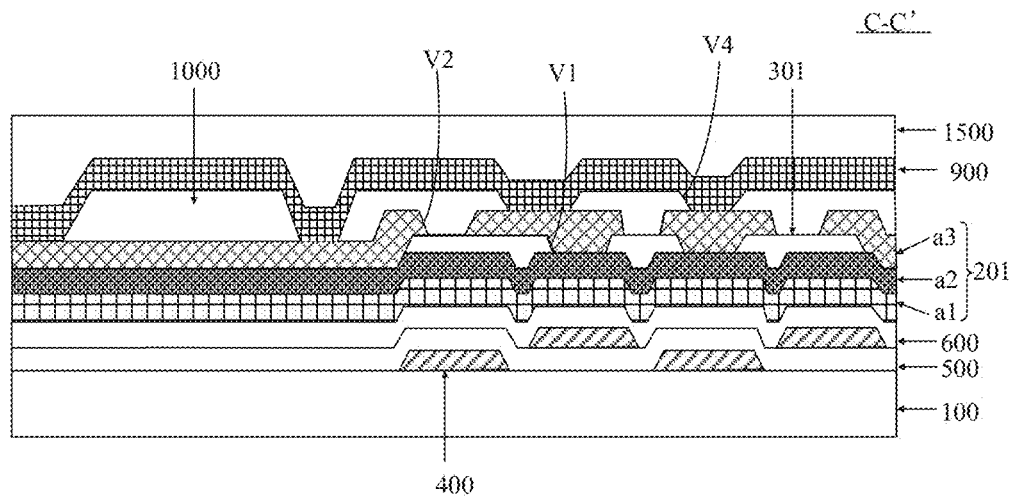
FIG. 15 is another structural schematic diagram of a film layer at a line C-C' of the display panel shown in FIG. 7.

In a first optional implementation, referring to FIG. 15, FIG. 15 is another structural schematic diagram of a film layer at a line C-C' of the display panel shown in FIG. 7. For the first power supply signal wiring 201 in the at least one signal wiring 200, the first power supply signal wiring 201 includes: a first sub-signal wiring a1, a second sub-signal wiring a2, and a third sub-signal wiring a3 that are arranged in a direction perpendicular to and facing away from the substrate 100. The first sub-signal wiring a1, the second sub-signal wiring a2, and the third sub-signal wiring a3 are mutually lapped, and are arranged in different layers. The first sub-signal wiring a1 is lapped with the second sub-signal wiring a2; and the second sub-signal wiring a2 is lapped with the third sub-signal wiring a3.

In some embodiments of the present disclosure, the at least one auxiliary layer 300 disposed in the non-display region 100b includes a first auxiliary layer 301 disposed between the second sub-signal wiring a2 and the third sub-signal wiring a3. Exemplarily, the first via V1 is formed in the first auxiliary layer 301, and the second sub-signal wiring a2 is lapped with the third signal wiring a3 by the first via V1. In this way, on the basis of ensuring that the second sub-signal wiring a2 and the third sub-signal wiring a3 are normally lapped, the flatness of the third sub-signal wiring a3 is improved by the first auxiliary layer 300, such that the flatness of the first power supply signal wiring 201 is great.

Figure 16:
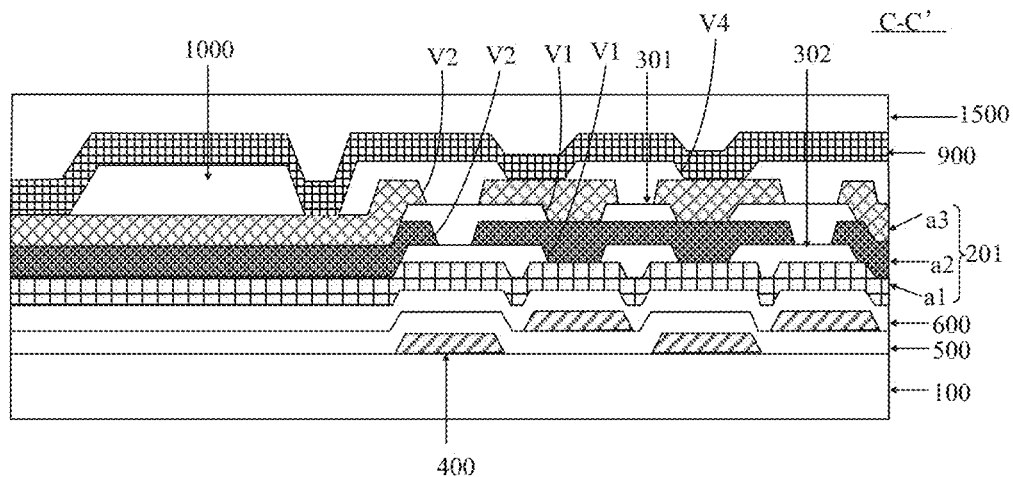
FIG. 16 is still another structural schematic diagram of a film layer at a line C-C' of the display panel shown in FIG. 7.

Optionally, referring to FIG. 16, FIG. 16 is still another structural schematic diagram of a film layer at a line C-C' of the display panel shown in FIG. 7. In some embodiments, the at least one auxiliary layer 300 further includes a second auxiliary layer 302 disposed between the first sub-signal wiring a1 and the second sub-signal wiring a2. An orthographic projection of the first via V1 in the first auxiliary layer 301 on the base substrate 100 is at least partially overlapped with an orthographic projection of the first via V1 in the second auxiliary layer 302 on the substrate 100.

In some embodiments of the present disclosure, the second sub-signal wiring a2 and the third sub-signal wiring a3 are provided with the second via V2. An orthographic projection of the second via V2 in the second sub-signal wiring a2 on the base substrate 100 is at least partially overlapped with an orthographic projection of the second via V2 in the third sub-signal wiring a3 on the substrate 100. The orthographic projection of the second via V2 on the substrate 100 is staggered from the orthographic projection of the first via V1 on the substrate 100.

It should be noted that, FIG. 5 gives description using a scenario where the at least one auxiliary layer 300 includes the first auxiliary layer 301 as an example; and FIG. 6 gives description using a scenario where the at least one auxiliary layer 300 includes the first auxiliary layer 301 and the second auxiliary layer 302 as an example. In other possible implementations, the at least one auxiliary layer 300 includes the second auxiliary layer 302. That is, in the display panel 000, only the second auxiliary layer 302 is arranged between the first sub-signal wiring a1 and the second sub-signal wiring a2.

Figure 17:
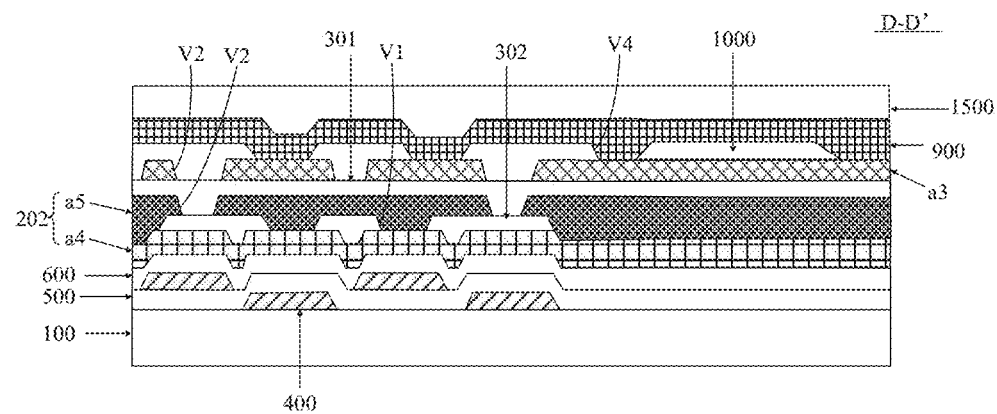
FIG. 17 is a is a structural schematic diagram of a film layer at a line D-D' of the display panel shown in FIG. 7.

In a second optional implementation, referring to FIG. 17, FIG. 17 is a is a structural schematic diagram of a film layer at a line D-D' of the display panel shown in FIG. 7. For the second power supply signal wiring 202 in the at least one signal wiring 200, the second power supply signal wiring 202 includes: a fourth sub-signal wiring a4 and a fifth sub-signal wiring a5 that are stacked. Exemplarily, the fourth sub-signal wiring a4 and the first sub-signal wiring a1 are arranged in a same layer and are made of a same material; and the fifth sub-signal wiring a5 and the second sub-signal wiring a2 are arranged in a same layer and are made of a same material. It should be noted that, in the embodiments of the present disclosure, one electrode and the other electrode are arranged in a same layer and are made of a same material refers to: the two electrodes are formed by a one-time patterning process.

In the present disclosure, the second auxiliary layer 302 is arranged between the fourth sub-signal wiring a4 and the fifth sub-signal wiring a5. Exemplarily, the first via V1 is formed in the second auxiliary layer 302, and the fourth sub-signal wiring a4 is lapped with the fifth sub-signal wiring a5 by the first via V1. In this way, on the basis of ensuring that the fourth sub-signal wiring a4 and the fifth sub-signal wiring a5 are normally lapped, the flatness of the fifth sub-signal wiring a5 is improved by the second auxiliary layer 302, such that the flatness of the second power supply signal wiring 202 is great.

In some embodiments of the present disclosure, a film layer structure of the compensation signal wiring is consistent with a film layer structure of the second power supply signal wiring 202. Therefore, description of the film layer structure of the compensation signal wiring is not given by the embodiments of the present disclosure.

In the embodiments of the present disclosure, the width of the non-display region 100b in the display panel 000 is small, and the first power supply signal wiring 201 and the second power supply signal wiring 202 are arranged in the non-display region 100b. Therefore, an orthographic projection of the first power supply signal wiring 201 on the substrate 100 is bound to be at least partially overlapped with an orthographic projection of the second power supply signal wiring 202 on the substrate 100. Exemplarily, as illustrated in FIG. 17, an orthographic projection of the third sub-signal wiring a3 in the first power supply signal wiring 201 on the substrate 100 is partially overlapped with an orthographic projection of the fifth sub-signal wiring a5 in the second power supply signal wiring 202 on the substrate 100. The third sub-signal wiring a3 is insulated from the fifth sub-signal wiring a5 by the first auxiliary layer 301. In this way, a short circuit is prevented from being occurred between the first power supply signal wiring 201 and the second power supply signal wiring 202.

Figure 18:
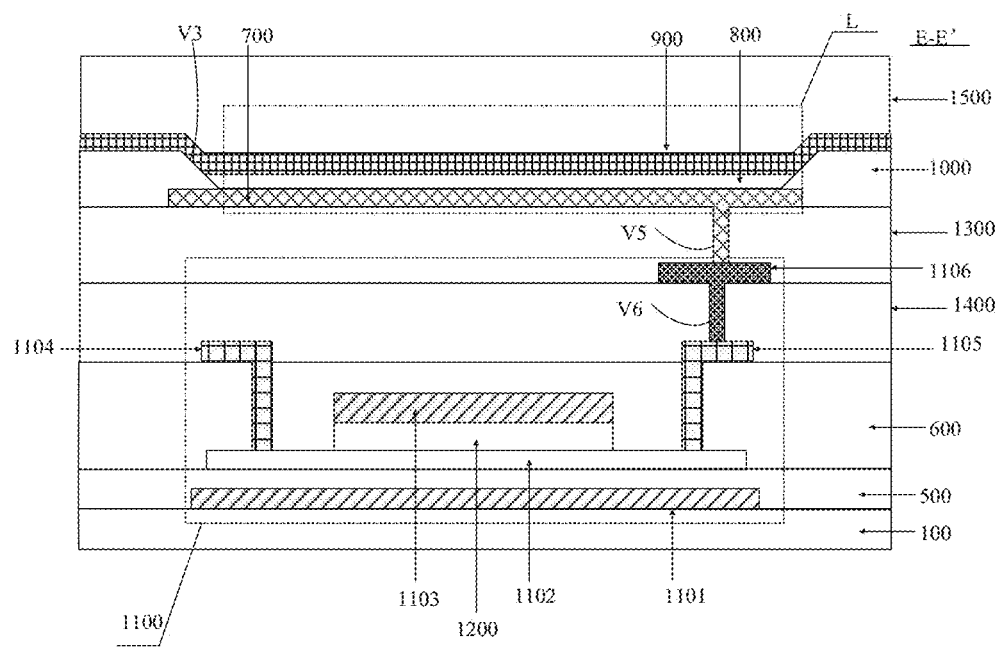
FIG. 18 is a is a structural schematic diagram of a film layer at a line E-E' line of the display panel shown in FIG. 7.

Optionally, referring to FIG. 18, FIG. 18 is a is a structural schematic diagram of a film layer at a line E-E' line of the display panel shown in FIG. 7. The display panel 000 includes: an anode layer 700, a light-emitting layer 800, and a cathode layer 900 that are stacked arranged. The anode layer 700, the light-emitting layer 800, and the cathode layer 900 are configured to form a plurality of light-emitting devices L in the display region 100a. In some embodiments, the light-emitting device L is an organic light-emitting display (OLED). Exemplarily, the display panel 000 further includes a pixel definition layer 1000. A portion of the pixel definition layer 1000 disposed within the display panel 100a includes a plurality of pixel holes V3. In each of the plurality of pixel holes V3, a portion of the anode layer 700 disposed within the pixel hole V3, a portion of the light-emitting layer 800 disposed within the pixel hole V3, and a portion of the cathode layer 900 disposed within the pixel hole V3 form one of the light-emitting devices L.

In some embodiments of the present disclosure, the first power supply signal wiring 201 is electrically connected to the cathode layer 900, and the first power supply signal wiring 201 is typically referred to as a VSS signal wiring; and the second power supply signal wiring 202 is electrically connected to the anode layer 700, and the second power supply signal wiring 202 is typically referred to as a VDD signal wiring.

Exemplarily, referring to FIG. 15 and FIG. 16, for a mode of the electrical connection between the first power supply signal wiring 201 and the cathode layer 900, a portion of the pixel definition layer 1000 in the display panel 000 disposed within the non-display region 100b includes a third via V4. An orthographic projection of the third via V4 on the substrate 100 is within the orthographic projection of the third sub-signal wiring a3 in the first power supply signal wiring 201 on the substrate 100. A portion of the cathode layer 900 disposed within the non-display region 100b is lapped with the third sub-signal wiring a3 by the third via V4. In this way, the cathode layer 900 is electrically connected to the first power supply signal wiring 201. A mode of the electrical connection between the second power supply signal wiring 202 and the anode layer 70 may refer to the relevant technology, which is not repeated herein.

In some embodiments of the present disclosure, as illustrated in FIG. 18, the display panel further includes a pixel drive circuit 1100 disposed within the display region 100a and electrically connected to the anode layer 900. Exemplarily, the number of the pixel drive circuit 1100 in the display panel 000 is multiple. The plurality of pixel drive circuits 1100 are electrically connected to the plurality of light-emitting devices L in one-to-one correspondence. For example, each of the pixel drive circuit 1100 is electrically connected to an anode of the corresponding light-emitting device L.

Optionally, the first sub-signal wiring a1 in the first power supply signal wiring 201 and a conductive structure in the pixel drive circuit 1100 are arranged in a same layer and are made of a same material; the second sub-signal wiring a2 in the first power supply signal wiring 201 and another conductive structure in the pixel drive circuit 1100 are arranged in a same layer and are made of a same material; and the third sub-signal wiring a3 in the first power supply signal wiring 201 and the anode layer 900 are arranged in a same layer and are made of a same material. In this way, the preparing process of the display panel 000 is effectively simplified, and the preparing costs of the display panel 000 is lowered.

Exemplarily, the pixel drive circuit 1100 includes: a light shielding layer 1101, an active layer 1102, a gate electrode 1103, a source electrode 1104, a drain electrode 1105, and a switching electrode 1106.

The light shielding layer 1101 is insulated from the active layer 1102 by the first inorganic insulative layer 500, and an orthographic projection of the active layer 1102 on the substrate 100 is within an orthographic projection of the light shielding layer 1101 on the substrate 100. In this way, the light shielding layer 1101 shields the active layer 1102, such that a voltage threshold offset is avoided occurring in the active layer 1102 when exposed to light.

The active layer 1102 is insulated from the gate electrode 1103 by a gate insulative layer 1200, and the active layer 1102 is electrically connected to the source electrode 1104 and the drain electrode 1105. In general, the source electrode 1104 and the drain electrode 1105 are arranged in a same layer. That is, the source electrode 1104 and the drain electrode 1105 are in a portion of a same conductive pattern. The conductive pattern where the source electrode 1104 and the drain electrode 1105 are disposed is insulated from the gate electrode 1103 by the second inorganic insulative layer 600. The source electrode 1104 and the drain electrode 1005 are lapped with the active layer 1102 by a via in the second inorganic insulative layer 1102.

In this case, the active layer 1102, the gate electrode 1103, the source electrode 1104, and the drain electrode 1105 form a thin-film transistor, and the embodiments of the present disclosure give schematic description using a scenario where the thin-film transistor is a top-gate type thin-film transistor as an example. In other optional implementations, the thin-film transistor is a bottom-gate type thin-film transistor, which is not limited herein.

In some embodiments, the display panel 000 further includes: a gate line and a data line that are disposed in the display region 100a. The gate line is electrically connected to the gate electrode 1104, the data line is electrically connected to one of the source electrode 1104 and the drain electrode 1105, and the other of the source electrode 1104 and the drain electrode 1105 is electrically connected to the anode layer 900 by the switching electrode 1106.

Exemplarily, a first flat layer 1300 is arranged between the switching electrode 1106 and the anode layer 900. The first flat layer 1300 includes a fourth via V5, and the switching electrode 1106 is lapped with the anode layer 900 by the fourth via V5. A second flat layer 1400 is arranged between the conductive pattern where the source electrode 1104 and the drain electrode 1105 are disposed and the switching electrode 1106. The second flat layer 1400 includes a fifth via V6, the other of the source electrode 1104 and the drain electrode 1105 is lapped with the switching electrode 1106 by the fifth via V6.

The first sub-signal wiring a1 in the above embodiments and the source electrode 1104 and the drain electrode 1105 in the pixel drive circuit 1100 are arranged in a same layer and are made of a same material; and the second sub-signal wiring a2 in the above embodiments and the switching electrode 1106 in the pixel drive circuit 1100 are arranged in a same layer and are made of a same material.

Optionally, the first flat layer 1300 and the first auxiliary layer 301 are formed by a one-time patterning process, and a thickness of the first auxiliary layer 301 is required to be less that a thickness of the first flat layer 1300; and the second flat layer 1400 and the second auxiliary layer 302 are formed by a one-time patterning process, and a thickness of the second auxiliary layer 301 is required to be less that a thickness of the second flat layer 1400.

The light shielding layer 1101 in the pixel drive circuit 1100 and the first fan-out lead group in the above embodiments are arranged in a same layer and are made of a same material; and the gate electrode 1103 in the pixel drive circuit 1100 and the second fan-out lead group in the above embodiments are arranged in a same layer and are made of a same material. In this way, the preparing process of the display panel 000 is further simplified.

According to the above embodiments, the display panel 000 in the embodiments of the present disclosure at least includes five layers of conductive patterns, which are: a first conductive pattern, a second conductive pattern, a third conductive pattern, a fourth conductive pattern, and a fifth conductive pattern.

The first conductive pattern is disposed between the substrate 100 and the first inorganic insulative layer 500, and at least includes: the light shielding layer 1101 and the at least two fan-out leads 400 in the first fan-out lead group.

The second conductive pattern is disposed between the first inorganic insulative layer 500 and the second inorganic insulative layer 600, and at least includes: the gate line, the gate electrode 1103, and the at least two fan-out leads 400 in the second fan-out lead group.

The third conductive pattern is disposed between the second inorganic insulative layer 600 and the second flat layer 1400, and at least includes: the data line, the source electrode 1104, the drain electrode 1105, the first sub-signal wiring a1, and the fourth sub-signal wiring a4.

The fourth conductive pattern is disposed between the second flay layer 1400 and the first flat layer 1300, and at least includes: the switching electrode 1106, the second sub-signal wiring a2, and the fifth sub-signal wiring a5.

The fifth conductive pattern is disposed between the first flat layer 1300 and the pixel definition layer 1000, and at least includes: the anode layer 900 and the third sub-signal wiring a3.

Optionally, as illustrated in FIG. 16, in some embodiments, the display panel 000 further includes a package layer 1500 disposed on a side, distal from the substrate 100, of the light-emitting device. In the display panel 000, the package layer 1500 is configured to package the light-emitting device in the display panel 000 to isolate the light-emitting device form external air, such that the light-emitting layer in the light-emitting device is prevented from being eroding by components such as water and oxygen in the air. The package layer 1500 includes: a first inorganic package layer, an organic package layer, and a second inorganic package layer that are stacked arranged.

In summary, the display panel according to the embodiments of the present disclosure includes: the substrate, the light-emitting device, the signal wiring, and the auxiliary layer. The auxiliary layer is disposed between two adjacent layers of the sub-signal wirings, and the two layers of the sub-signal wirings disposed on both sides of the auxiliary layer are lapped with each other by the first via in the auxiliary layer. Therefore, on the basis of ensuring that the two adjacent layers of the sub-signal wirings are normally lapped, the flatness of the sub-signal wiring, distal from the substrate, in the two adjacent layers of the sub-signal wirings is improved by the auxiliary layer, such that the flatness of the signal wiring is great. In this way, the probability of the film fracture or the film separation occurred in film layers disposed above the sub-signal wiring in the display panel is effectively reduced, and thus the yield of the display panel is effectively improved.

Some embodiments of the present disclosure further provide a method for preparing a display panel. The method is employed to prepare the display panel 000 shown in FIG. 6. The method includes the following steps.

A light-emitting device, at least one signal wiring, and at least one auxiliary layer are formed on a substrate; wherein
the display panel is provided with a display region and a non-display region disposed on a periphery of the display region, wherein the light-emitting device is disposed in the display region, and the at least one signal wiring and the at least one auxiliary layer are disposed in the non-display region;
the signal wiring is electrically connected to the light-emitting device, and includes at least two layers of sub-signal wirings, wherein two adjacent layers of the sub-signal wirings are arranged in different layers, and are lapped with each other; and
the auxiliary layer is disposed between two adjacent layers of the sub-signal wirings, and includes a first via, wherein the sub-signal wiring disposed on a side, proximal to the substrate, of the auxiliary layer is lapped with the sub-signal wiring disposed on a side, distal from the substrate, of the auxiliary layer by the first via.

It may be clearly understood by those skilled in the art that, for the convenience and conciseness of the description, the specific principles of the display panel described above may refer to the corresponding content in the embodiments of the structure of the display panel, which is not repeated herein.

In summary, in the method for preparing the display panel according to the embodiments of the present disclosure, the auxiliary layer is deposed between two adjacent layers of the sub-signal wirings, and the two layers of the sub-signal wirings disposed on both sides of the auxiliary are lapped with each other by the first via in the auxiliary layer. Therefore, on the basis of ensuring that the two adjacent layers of the sub-signal wirings are normally lapped, the flatness of the sub-signal wiring, distal from the substrate, in the two adjacent layers of the sub-signal wirings is improved by the auxiliary layer, such that the flatness of the signal wiring is great. In this way, the probability of the film fracture or the film separation occurred in film layers disposed above the sub-signal wiring in the display panel is effectively reduced, and thus the yield of the display panel is effectively improved.

The method for preparing the display panel is configured to prepare the display panel shown in FIG. 15. The method includes the following steps.

In step S1, the first conductive pattern is formed on the substrate.

Exemplarily, a first conductive thin film is formed by performing any one of deposition, coating, and sputtering on the substrate. Then the first conductive pattern is acquired by performing a one-time patterning process on the first conductive thin film. The first conductive pattern includes: a light shielding layer and at least two fan-out leads in a first fan-out lead group. Optionally, the first conducive pattern is made of, an aluminum metal, a silver metal, a molybdenum metal, or an alloy material.

In step S2, a first inorganic insulative layer, an active layer pattern, a gate insulative layer, and a second conductive pattern are successively formed on the first conductive pattern.

First, the first inorganic insulative layer is form by performing any one of deposition, coating, and sputtering on the substrate where the first conductive pattern is formed. Optionally, the first inorganic insulative layer is made of: silicon nitride, silicon dioxide, silicon oxynitride, or inorganic materials.

Then, an active layer thin film is formed by performing any one of deposition, coating, and sputtering on the substrate where the first inorganic insulative layer is formed. The active layer pattern is acquired by performing the one-time patterning process on the active layer thin film. An orthographic projection of the active layer pattern on the substrate is within an orthographic projection of the light shielding layer on the substrate. The active layer pattern includes active layers in thin-film transistors subsequently formed. Optionally, the active layer pattern is made of: polysilicon, amorphous silicon, oxide semiconductor, or semiconductor materials.

Afterwards, an insulative thin film is formed by performing any one of deposition, coating, and sputtering on the substrate where the active layer pattern is formed. Optionally, the insulative thin film is made of: silicon nitride, silicon dioxide, silicon oxynitride, or inorganic materials.

Afterwards, a second conductive thin film is formed by performing any one of deposition, coating, and sputtering on the substrate where the insulative thin film is formed. Then the second conductive pattern is acquired by performing the one-time patterning process on the second conductive thin film. The second conductive pattern includes: a gate line, a gate electrode, and at least two fan-out leads in a second fan-out lead group. Optionally, the second conducive pattern is made of: an aluminum metal, a silver metal, a molybdenum metal, or an alloy material.

Finally, the gate insulative layer of which a shape is consistent with a shape of the second conductive pattern is acquired by etching on the insulative film layer using the second conductive pattern as a mask film, and a portion of the active layer pattern that is not covered by the gate insulative layer is performed a conductor process to reduce a resistance between the active layer pattern and the source-drain electrode pattern that are subsequently lapped.

In step S3, a second inorganic insulative layer and a third conductive pattern are successively formed on the second conductive pattern.

First, the second inorganic insulative layer is formed by performing any one of deposition, coating, and sputtering on the substrate where the second conductive pattern is formed. A via for allowing the active layer pattern to lap with the source-drain electrode pattern is formed by performing the one-time patterning process on the second inorganic insulative layer. Optionally, the second inorganic insulative layer is made of, silicon nitride, silicon dioxide, silicon oxynitride, or inorganic materials.

Afterwards, a third conductive thin film is formed by performing any one of deposition, coating, and sputtering on the substrate where the second inorganic insulative layer is formed. The third conductive pattern is acquired by performing the one-time process on the third conductive thin film. The third conductive pattern includes: a data line, a source electrode, a drain electrode, a first sub-signal wiring, and a fourth sub-signal wiring. Optionally, the third conductive pattern is made of, an aluminum metal, a silver metal, a molybdenum metal, or an alloy material.

In step S4, a second flat layer and a fourth conductive pattern are successively formed on the third conductive pattern.

First, the second flat layer is formed by performing any one of deposition, coating, and sputtering on the substrate where the second conductive pattern is formed; and then a fifth via for allowing a switching electrode to lap with the drain electrode is formed by performing the one-time process on the second flat layer.

Afterwards, a fourth conductive thin film is formed by performing any one of deposition, coating, and sputtering on the substrate where the second flat layer is formed. The fourth conductive pattern is acquired by performing the one-time patterning process on the fourth conductive thin film. The fourth conductive pattern includes: the switching electrode, a second sub-signal wiring, and a fifth sub-signal wiring. Optionally, the fourth conductive pattern is made of an aluminum metal, a silver metal, a molybdenum metal, or an alloy material.

In step S5, a first flat layer and a fifth conductive pattern are successively formed on the fourth conductive pattern.

First, the first flat layer is formed by performing any one of deposition, coating, and sputtering on the substrate where the fourth conductive pattern is formed. A fourth via for allowing an anode layer to lap with the switching electrode is formed by performing the one-time patterning process on the first flat layer.

Afterwards, a fifth conductive thin film is formed by performing any one of deposition, coating, and sputtering on the substrate where the first flat layer, the fifth conductive pattern is acquired by performing the one-time patterning process on the fifth conductive thin film. The fifth conductive pattern includes: the anode layer and a third sub-signal wiring. Optionally, the fifth conductive thin film is made of: an aluminum metal, a silver metal, a molybdenum metal, or an alloy material.

In step S6, a pixel definition layer, a light-emitting layer, a cathode layer, and a package layer are successively formed on the fifth conductive pattern.

First, a pixel definition thin film is formed by performing any one of deposition, coating, and sputtering on the substrate where the fifth conductive pattern is formed. A plurality of pixel holes are formed in a portion of the pixel definition layer disposed within the display region by performing the one-time patterning process on the pixel definition thin film. In each of the plurality of pixel holes, a portion of the anode layer disposed within the pixel hole, a portion of the light-emitting layer disposed within the pixel hole, and a portion of the cathode layer disposed within the pixel hole form a light-emitting device L. Optionally, the pixel definition layer is made of at least one of: a polymer based on polymethyl methacrylate and polystyrene, a polymer and derivatives based on phenol groups, a polymers based on acrylic, a polymer based on p-xylene, a polymer based on aryl ethers, a polymer based on amides, a polymer based on fluorides, a polymer based on vinyl alcohol.

Afterwards, the light-emitting layer is formed by performing an evaporation process or an inkjet printing process on the substrate where the pixel definition layer is formed. Optionally, the light-emitting layer is made of phosphorescent or fluorescent luminescent materials.

Afterwards, the cathode layer is formed by performing a sputtering process on the substrate where the light-emitting layer is formed. Optionally, the cathode layer is made of ITO or IZO.

Finally, the package layer is formed by performing any one of deposition, coating, and sputtering on the substrate where the cathode layer is formed. The package layer includes: a first inorganic package layer, an organic package layer, and a second inorganic package layer that are stacked arranged.

It should be noted that, the one-time patterning process in the above embodiments refers to: photoresist coating, exposing, developing, etching, and photoresist stripping.

In summary, in the method for preparing the display panel according to the embodiments of the present disclosure, the auxiliary layer is deposed between two adjacent layers of the sub-signal wirings, and the two layers of the sub-signal wirings disposed on both sides of the auxiliary are lapped with each other by the first via in the auxiliary layer. Therefore, on the basis of ensuring that the two adjacent layers of the sub-signal wirings are normally lapped, the flatness of the sub-signal wiring, distal from the substrate, in the two adjacent layers of the sub-signal wirings is improved by the auxiliary layer, such that the flatness of the signal wiring is great. In this way, the probability of the film fracture or the film separation occurred in film layers disposed above the sub-signal wiring in the display panel is effectively reduced, and thus the yield of the display panel is effectively improved.

The embodiments of the present disclosure also provide a display device. The display device may be a smart phone, a table computer, a television, a display, a notebook computer, a digital photo frame, a navigator, and any other products with display functions. The display device includes: a power supply assembly (not shown in the drawings) and a display panel 000. In some embodiments, the display panel is the display panel as describe above, such as the display panel shown in FIG. 6, FIG. 8, FIG. 15, FIG. 16, or FIG. 17. The power supply assembly is connected to the display panel, and is configured to supply power to the display panel 000, such that the display panel displays pictures.

It should be pointed out that in the accompanying drawings, the sizes of layers and regions may be exaggerated for clearer illustration. It should be understood that in the case that an element or layer is referred to as being "on" another element or layer, it may be directly on another element, or intervening layers may be present. In addition, it should be understood that in the case that an element or layer is referred to as being "under" another element or layer, the layer may be directly under the other element, or there may be more than one intervening layer or element. In addition, it can further be understood that in the case that a layer or element is referred to as being "between" two layers or two elements, the layer may be the only layer between the two layers or two elements, or more than one intervening layer or element may also be present. Similar reference numerals indicate similar elements throughout.

In the present disclosure, the terms "first" and "second" are only used for descriptive purposes, and cannot be understood as indicating or implying relative importance. The term "a plurality of" refers to two or more, unless expressly defined otherwise.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display panel, provided with a display region and a non-display region disposed on a periphery of the display region, the display panel comprising:
   a substrate;
   a light-emitting device disposed in the display region;
   at least one signal wiring disposed in the non-display region, wherein the signal wiring is electrically connected to the light-emitting device, and the signal wiring comprises at least two layers of sub-signal wirings, two adjacent layers of the sub-signal wirings being disposed in different layers and lapped with each other; and
   at least one auxiliary layer disposed in the non-display region, wherein the auxiliary layer is disposed between two adjacent layers of the sub-signal wirings, and the auxiliary layer comprises a first via, the sub-signal wiring disposed on a side, proximal to the substrate, of the auxiliary layer being lapped with the sub-signal wiring disposed on a side, distal from the substrate, of the auxiliary layer by the first via,
   wherein the non-display region comprises a fan-out region, an orthographic projection of the auxiliary layer on the substrate being at least partially overlapped with an orthographic projection of the fan-out region on the substrate, and the sub-signal wiring comprises a first portion disposed in the fan-out region, the first portions of two layers of the sub-signal wirings being lapped with each other by the first via.

2. The display panel according to claim 1, wherein the orthographic projection of the auxiliary layer on the substrate is within the orthographic projection of the fan-out region on the substrate, and the sub-signal wiring comprises a second portion disposed outside the fan-out region, the second portions of two layers of the sub-signal wirings being contacted.

3. The display panel according to claim 1, further comprising: a plurality of fan-out leads disposed in the fan-out region and insulated from the signal wiring, wherein an orthographic projection of at least a portion of the first via on the substrate is within an orthographic projection of the fan-out lead on the substrate;
   wherein the fan-out lead is configured to be electrically connected to a data signal line in the display region, the data signal line being electrically connected to the light-emitting device.

4. The display panel according to claim 3, wherein the fan-out lead comprises: a sub fan-out lead, an interposer lead, and a compensation lead that are successively connected in series, wherein one end, distal from the interposer lead, of the sub fan-out lead is configured to be electrically connected to the data signal line, and one end, distal from the interposer lead, of the compensation lead is configured to be electrically connected to a drive chip;
   wherein a wiring density of the sub fan-out leads in the fan-out region and a wiring density of the compensation leads in the fan-out region are both greater than a wiring density of the interposer leads in the fan-out region, and the orthographic projection of the auxiliary layer on the substrate is within a region where the sub fan-out lead is disposed and a region where the compensation lead is disposed, and is outside a region where the interposer lead is disposed.

5. The display panel according to claim 3, wherein any two adjacent of the fan-out leads are disposed in different layers.

6. The display panel according to claim 1, wherein in two layers of the sub-signal wirings, the sub-signal wiring that is distal from the substrate relative to the auxiliary layer comprises a second via, an orthographic projection of the second via on the substrate being staggered from an orthographic projection of the first via on the substrate.

7. The display panel according to claim 1, wherein the at least one signal wiring comprises a first power supply signal wiring, wherein the first power supply signal wiring comprises: a first sub-signal wiring, a second sub-signal wiring, and a third sub-signal wiring that are arranged in a direction perpendicular to and facing away from the substrate; and
the at least one auxiliary layer comprises a first auxiliary layer disposed between the second sub-signal wiring and the third sub-signal wiring.

8. The display panel according to claim 7, wherein the at least one auxiliary layer further comprises a second auxiliary layer disposed between the first sub-signal wiring and the second sub-signal wiring, an orthographic projection of the first via in the first auxiliary layer on the substrate being at least partially overlapped with an orthographic projection of the first via in the second auxiliary layer on the substrate.

9. The display panel according to claim 8, wherein the second sub-signal wiring and the third sub-signal wiring both comprise the second via, an orthographic projection of the second via in the second sub-signal wiring on the substrate being at least partially overlapped with an orthographic projection of the second via in the third sub-signal wiring on the substrate, and the orthographic projection of the second via on the substrate being staggered from the orthographic projection of the first via on the substrate.

10. The display panel according to claim 8, comprising: an anode layer, a light-emitting layer, and a cathode layer that are stacked arranged, and the anode layer, the light-emitting layer, and the cathode layer that are stacked arranged form the light-emitting device, wherein the first power supply signal wiring is electrically connected to the cathode layer, and the anode layer is configured to be electrically connected to a second power supply signal wiring.

11. The display panel according to claim 10, further comprising: a pixel definition layer, wherein a portion of the pixel definition layer disposed within the non-display region comprises a third via, an orthographic projection of the third via on the substrate being within the orthographic projection of the third sub-signal wiring on the substrate, and a portion of the cathode layer disposed within the non-display region being lapped with the third sub-signal wiring by the third via.

12. The display panel according to claim 11, further comprising a pixel drive circuit disposed in the display region and electrically connected to the anode layer, wherein the first sub-signal wiring and a conductive structure in the pixel drive circuit are arranged in a same layer, the second sub-signal wiring and another conductive structure in the pixel drive circuit are arranged in a same layer, and the third sub-signal wiring and the anode layer are arranged in a same layer.

13. The display panel according to claim 7, wherein the at least one signal wiring further comprises a second power supply signal wiring, wherein the second power supply signal wiring comprises: a fourth sub-signal wiring disposed in a same layer with the first sub-signal wiring and a fifth sub-signal wiring disposed in a same layer with the second sub-signal wiring; and
the at least one auxiliary layer further comprises a second auxiliary layer disposed between the fourth sub-signal wiring and the fifth sub-signal wiring.

14. The display panel according to claim 13, wherein an orthographic projection of the third sub-signal wiring on the substrate is at least partially overlapped with an orthographic projection of the fourth sub-signal wiring on the substrate, and the third sub-signal wiring is insulated from the fifth sub-signal wiring by the first auxiliary layer.

15. The display panel according to claim 1, further comprising: a package layer disposed on a side, distal from the substrate, of the light-emitting device.

16. A method for preparing a display panel, the method comprising:
forming a light-emitting device, at least one signal wiring, and at least one auxiliary layer on a substrate; wherein the display panel is provided with a display region and a non-display region disposed on a periphery of the display region, wherein the light-emitting device is disposed in the display region, and the at least on signal wiring and the at least one auxiliary layer are disposed in the non-display region;
the signal wiring is electrically connected to the light-emitting device, and the signal wiring comprises at least two layers of sub-signal wirings, wherein two adjacent layers of the sub-signal wirings are arranged in different layers and lapped with each other; and
the auxiliary layer is disposed between two adjacent layers of the sub-signal wirings, and the auxiliary layer comprises a first via, wherein the sub-signal wiring disposed on a side, proximal to the substrate, of the auxiliary layer is lapped with the sub-signal wiring disposed on a side, distal from the substrate, of the auxiliary layer by the first via,
wherein the non-display region comprises a fan-out region, an orthographic projection of the auxiliary layer on the substrate being at least partially overlapped with an orthographic projection of the fan-out region on the substrate, and the sub-signal wiring comprises a first portion disposed in the fan-out region, the first portions of two layers of the sub-signal wirings being lapped with each other by the first via.

17. A display device, the display device comprising: a power supply assembly, and a display panel,
wherein the power supply assembly is connected to the display panel, and is configured to supply power to the display panel; and
the display panel is provided with a display region and a non-display region disposed on a periphery of the display region, and the display panel comprises:
a substrate;
a light-emitting device disposed in the display region;
at least one signal wiring disposed in the non-display region, wherein the signal wiring is electrically connected to the light-emitting device, and the signal wiring comprises at least two layers of sub-signal wirings, two adjacent layers of the sub-signal wirings being disposed in different layers and lapped with each other; and
at least one auxiliary layer disposed in the non-display region, wherein the auxiliary layer is disposed between two adjacent layers of the sub-signal wirings, and the auxiliary layer comprises a first via, the sub-signal wiring disposed on a side, proximal to the substrate, of the auxiliary layer being lapped with the sub-signal wiring disposed on a side, distal from the substrate, of the auxiliary layer by the first via, wherein the non-display region comprises a fan-out region, an orthographic projection of the auxiliary layer on the substrate being at least partially overlapped with an orthographic projection of the fan-out region on the substrate, and the sub-signal wiring comprises a first portion disposed in the fan-out region, the first portions of two layers of the sub-signal wirings being lapped with each other by the first via.

18. The display device according to claim 17, wherein the orthographic projection of the auxiliary layer on the substrate is within the orthographic projection of the fan-out region on the substrate, and the sub-signal wiring comprises a second portion disposed outside the fan-out region, the second portions of two layers of the sub-signal wirings being contacted.

\* \* \* \* \*